United States Patent
Miyao et al.

(10) Patent No.: US 10,066,320 B2
(45) Date of Patent: Sep. 4, 2018

(54) POLYCRYSTALLINE SILICON, FZ SINGLE CRYSTAL SILICON, AND METHOD FOR PRODUCING THE SAME

(71) Applicant: Shin-Etsu Chemical Co., Ltd., Tokyo (JP)

(72) Inventors: Shuichi Miyao, Niigata (JP); Shigeyoshi Netsu, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 15/432,171

(22) Filed: Feb. 14, 2017

(65) Prior Publication Data

US 2017/0283986 A1   Oct. 5, 2017

(30) Foreign Application Priority Data

Apr. 4, 2016   (JP) .................................. 2016-075072

(51) Int. Cl.
| | |
|---|---|
| C30B 29/06 | (2006.01) |
| C30B 28/14 | (2006.01) |
| C30B 13/08 | (2006.01) |
| C23C 16/24 | (2006.01) |

(52) U.S. Cl.
CPC .............. *C30B 28/14* (2013.01); *C23C 16/24* (2013.01); *C30B 13/08* (2013.01); *C30B 29/06* (2013.01)

(58) Field of Classification Search
CPC .......... C30B 29/04; C30B 29/06; C30B 13/00
See application file for complete search history.

(56) References Cited

U.S. PATENT DOCUMENTS

| | | | |
|---|---|---|---|
| 2002/0014197 A1* | 2/2002 | Keck ....................... C23C 16/24 117/87 |
| 2008/0286550 A1 | 11/2008 | Sofin et al. | |
| 2009/0239151 A1* | 9/2009 | Nakanishi ........... H01M 4/0428 429/231.95 |
| 2011/0229717 A1* | 9/2011 | Kraus .................... C01B 33/035 428/375 |
| 2017/0058427 A1 | 3/2017 | Miyao et al. | |

FOREIGN PATENT DOCUMENTS

| | | |
|---|---|---|
| EP | 2 631 215 A1 | 8/2013 |
| EP | 2 692 909 A1 | 2/2014 |

(Continued)

OTHER PUBLICATIONS

Susanne Richter, et al., "Structural and chemical investigations of adapted Siemens feed rods for an optimized float zone process", Science Direct, Energy Procedia, 38, 2013, pp. 604-610.

*Primary Examiner* — Robert M Kunemund
(74) *Attorney, Agent, or Firm* — Oblon, McClelland, Maier & Neustadt, L.L.P.

(57) ABSTRACT

When FZ single crystal silicon is produced from polycrystalline silicon, which is synthesized by the Siemens method followed by being subjected to thermal treatment and includes crystal grains having a Miller index plane <111> or <220> as a principal plane and grown by the thermal treatment, and in which the X-ray diffraction intensity from either of the Miller index planes <111> and <220> after the thermal treatment is 1.5 times or less the X-ray diffraction intensity before the thermal treatment, as raw material, disappearance of crystal lines in the step of forming an FZ single crystal is markedly prevented.

7 Claims, 8 Drawing Sheets

(56) References Cited

FOREIGN PATENT DOCUMENTS

| | | |
|---|---|---|
| EP | 2 835 632 A1 | 2/2015 |
| EP | 2 863 212 A1 | 4/2015 |
| JP | 2008-285403 | 11/2008 |
| WO | WO 2015/170459 A1 | 11/2015 |

\* cited by examiner

POLYCRYSTALLINE SILICON, FZ SINGLE CRYSTAL SILICON, AND METHOD FOR PRODUCING THE SAME

BACKGROUND OF THE INVENTION

Field of the Invention

The present invention relates to a technique for producing polycrystalline silicon columns suitable for stably producing single crystal silicon.

Description of the Related Art

Crystals of single crystal silicon essential for production of devices such as semiconductor devices are grown as a crystal by the CZ method or the FZ method, and a polycrystalline silicon column or a polycrystalline silicon ingot is used as the raw material in such a case. Such a polycrystalline silicon material is produced, in many cases, by the Siemens method. The Siemens method is a method in which a gas of a silane raw material such as trichlorosilane or monosilane is brought into contact with a heated silicon core wire to thereby allow polycrystalline silicon to grow in the vapor phase (deposit) on the surface of the silicon core wire by the CVD (Chemical Vapor Deposition) method.

For example, when crystals of single crystal silicon are grown by the CZ method, a polycrystalline silicon ingot is charged in a quartz crucible and heated to be melted, a seed crystal is dipped in the resulting silicon melt to extinguish dislocation lines to be made free from dislocation, and then the crystal pulling up is performed while the crystal diameter is being slowly increased until the diameter of the crystal reaches a predetermined diameter. In this case, when unmelted polycrystalline silicon remains in the silicon melt, the unmelted polycrystalline pieces drift in the vicinity of the solid-liquid interface by convection to induce the generation of dislocation, and thus the polycrystalline silicon remaining unmelted causes the crystal line to disappear.

Patent Literature 1 reports that needle crystals may be deposited during a process of producing a polycrystalline silicon column (polycrystalline silicon rod) by the Siemens method, and that if single crystal silicon is grown by the FZ method using such a polycrystalline silicon column, due to the aforementioned inhomogeneous microstructure, individual crystallites are not melted homogeneously according to their sizes, but the unmeltable crystallites pass through the melting zone as solid particles toward the single-crystal rod and become incorporated into the solidification surface of the monocrystal as unmelted particles, thereby causing defect formation.

To address this problem, Patent Literature 1 proposes a technique, in which the surface of a sample, which is cut out perpendicularly to the longitudinal direction of the polycrystalline silicon column, is ground or polished, and after etching, the contrast of the microcrystals of the structure is enhanced to such a degree that the microcrystals are visible even under an optical microscope, and the size and area ratio of needle crystals are measured, and on the basis of the measurement result, whether or not the polycrystalline silicon column is acceptable as the raw material for growing single crystal silicon by the FZ method is determined.

CITATION LIST

Patent Literature

Patent Literature 1: Japanese Patent Laid-Open No. 2008-285403

SUMMARY OF THE INVENTION

Technical Problem

However, visual determination of acceptability under an optical microscope like the technique disclosed in Patent Literature 1 not only is prone to variation of results depending on the degree of etching on the surface of the sample to be observed, the observational skills of the person in charge of evaluation, etc., but also lacks quantitativity and reproducibility. For this reason, it is necessary, from the viewpoint of increasing the production yield of single crystal silicon, to set the criteria for determining acceptability higher, which results in a higher rate of defective products.

According to studies conducted by the present inventors, it has been also found that the technique disclosed in Patent Literature 1, even when a polycrystalline silicon column which is determined to be acceptable is used, can cause dislocation and disappearance of crystal lines during a process of growing a single crystal silicon rod by the FZ method.

Thus, in order to stably produce single crystal silicon at a high yield, a technique for selecting polycrystalline silicon suitable as the raw material for producing single crystal silicon with high quantitativity and reproducibility is required.

The present invention has been made in view of such problems and aims to provide a technique for selecting polycrystalline silicon suitable as the raw material for producing single crystal silicon with high quantitativity and reproducibility to thereby contribute to stable production of single crystal silicon.

Solution to Problem

In order to solve the above-described problems, the polycrystalline silicon according to the present invention is a polycrystalline silicon obtained by synthesis by the Siemens method followed thermal treatment, wherein crystal grains having Miller index planes <111> and <220> as a principal plane are grown by the thermal treatment.

In an aspect, the crystal grains have an increased grain size due to the thermal treatment, and in another aspect, the thermal diffusivity varies between before and after the thermal treatment.

Additionally, in an aspect, an X-ray diffraction intensity from either of the Miller index planes <111> and <220> after the thermal treatment is 1.5 times or less the X-ray diffraction intensity before the thermal treatment.

Furthermore, in an aspect, the average crystal grain size after the thermal treatment is three times or more the average crystal grain size before the thermal treatment.

Moreover, in an aspect, the thermal diffusivity in a plane perpendicular to the growth direction increases after the thermal treatment.

Advantageous Effects of Invention

It is possible to suppress local generation of partial melting residue and contribute to stable production of single crystal silicon by evaluating a degree of crystal orientation of a polycrystalline silicon column by the method according to the present invention, and by growing crystals by the FZ method using a polycrystalline silicon column selected as an acceptable one by this evaluation or growing crystals by the CZ method using an ingot obtained by pulverizing a polycrystalline silicon column.

DETAILED DESCRIPTION OF THE PREFERRED EMBODIMENTS

In the following, embodiments of the present invention will be described with reference to the drawings. Incidentally, in the following, for extracting a plate-like sample, an aspect in which a plate-like sample having a section perpendicular to the radial direction of a polycrystalline silicon column as the principal plane is extracted is described, but an aspect in which a plate-like sample having a section parallel to the radial direction of a polycrystalline silicon column as the principal plane is extracted is also included.

While conducting studies aimed at improving the quality of polycrystalline silicon for stable production of single crystal silicon, the present inventors have found that, depending on the conditions at the time of deposition of polycrystalline silicon, differences occur in the degree of crystal orientation in a polycrystalline silicon column. A block (ingot) of polycrystalline silicon, unlike that of single crystal silicon, contains many crystal grains, and it is generally believed that each of these many crystal grains is randomly oriented. According to the studies of the present inventors, however, the crystal grains contained in a polycrystalline silicon block are not always completely random-oriented.

A powder sample which can be obtained by pulverizing a polycrystalline silicon block can be handled on the supposition that the individual silicon crystal grains are completely random-oriented. In fact, when the powder sample is disposed at a position at which a Bragg reflection from a specific Miller index plane <hkl> is detected and the powder sample is rotated in a plane, with the center of the sample as the rotation center, such that an X-ray irradiation region defined by a slit scans the entire surface of the powder sample, the Bragg reflection intensity is substantially constant. In other words, the intensity of the Bragg reflection from the aforementioned Miller index plane <hkl> exhibits no dependency on the rotation angle.

By contrast, when the present inventors extracted plate-like samples, of which the principal plane is the cross-section of a polycrystalline silicon column perpendicular to the radial direction, from many different polycrystalline silicon columns grown through deposition by the chemical vapor deposition method, and using the same technique as described above, checked for the dependency of the intensity of the Bragg reflection from the Miller index plane <hkl> on the rotation angle, the facts were confirmed that, depending on the production conditions of a polycrystalline silicon column, the intensity of the Bragg reflection from the Miller index plane <hkl> is dependent on the rotation angle and peaks may appear in a diffraction chart, and the shape and the number of the peaks are also dependent on the production conditions.

That is, crystal grains in a polycrystalline silicon column are not always random-oriented, but the degree of crystal orientation (random orientation) depends on the conditions at the time of deposition of polycrystalline silicon. It has been proven that, when a polycrystalline silicon column or a polycrystalline silicon ingot having a relatively high degree of crystal orientation (relatively low random orientation) is used as the raw material for producing single crystal silicon, partial melting residue may locally occur, which may induce generation of dislocation and even cause loss of crystal lines.

With regard to this point, the present inventors have made extensive studies focusing on the Miller index planes <111> and <220> and, as a result, have found, by evaluation of plate-like samples extracted from polycrystalline silicon columns grown through deposition by a chemical vapor deposition method such as the Siemens method by the XRD method, that the X-ray diffraction intensity from the Miller index planes <111> and <220> varies due to thermal treatment after synthesis by the Siemens method is completed and that, when FZ single crystal silicon is produced from a polycrystalline silicon column including crystal grains having a Miller index plane <111> or <220> as a principal plane and grown due to thermal treatment as the raw material, disappearance of crystal lines in a step of forming an FZ single crystal is substantially completely prevented.

Figure 1A:
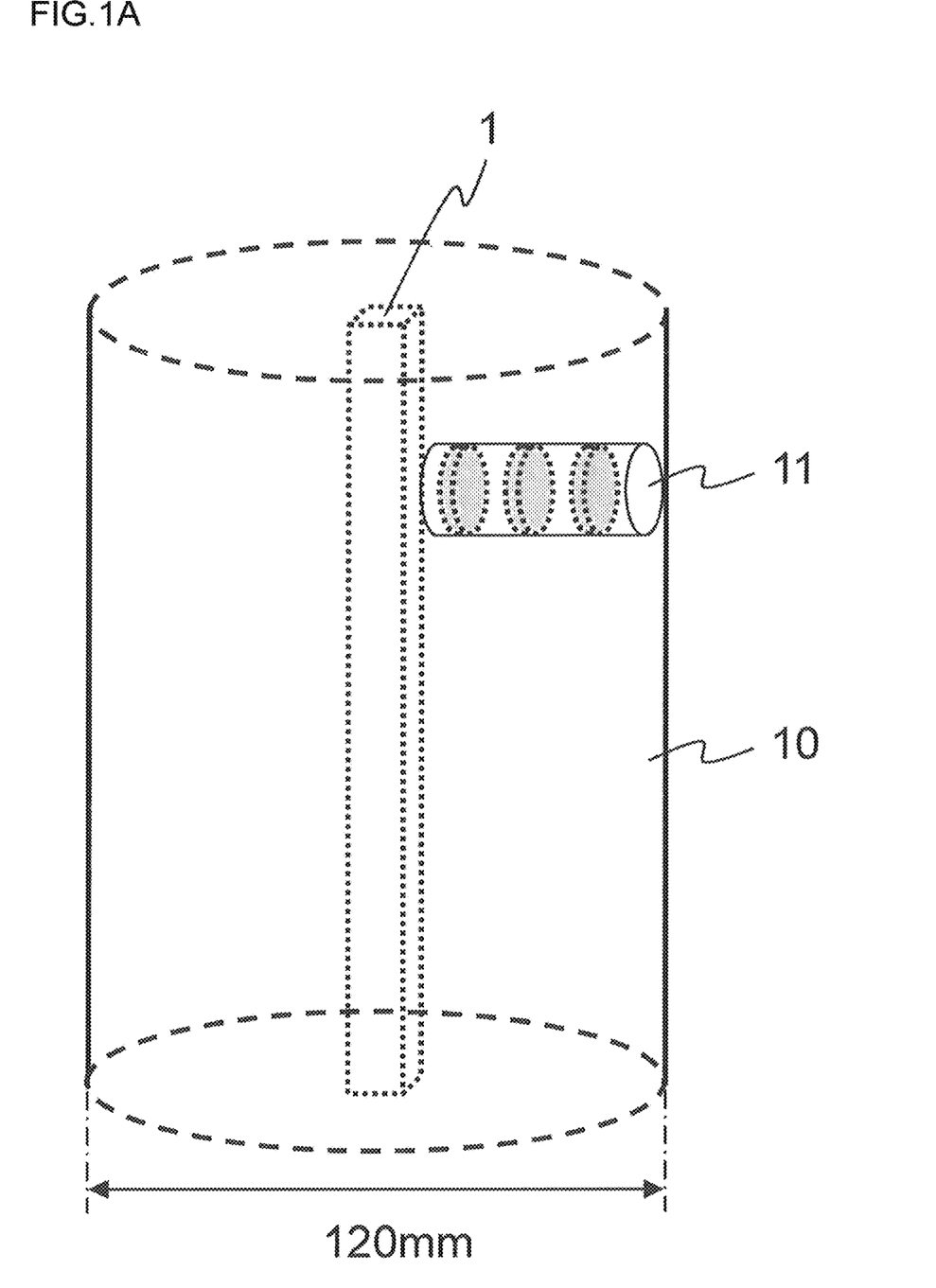
FIG. 1A is a view illustrating an example of extraction of plate-like samples for X-ray diffraction measurement from a polycrystalline silicon column which is grown through deposition by the chemical vapor deposition method.
Figure 1B:
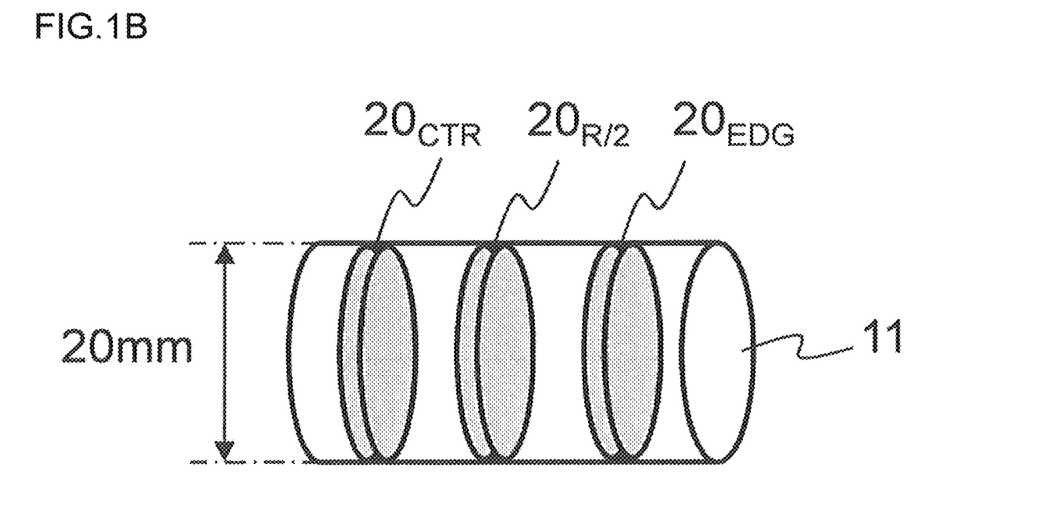
FIG. 1B is a view illustrating an example of extraction of plate-like samples for X-ray diffraction measurement from the polycrystalline silicon column which is grown through deposition by the chemical vapor deposition method.

FIG. 1A and FIG. 1B are views for illustrating an example of extraction of plate-like samples 20 used for X-ray diffraction profile measurement from a polycrystalline silicon column 10, which is grown through deposition by the chemical vapor deposition method such as the Siemens method. In the figure, the reference sign 1 denotes a silicon core wire, on the surface of which polycrystalline silicon is deposited to make a silicon column. In this example, the plate-like samples 20 are extracted from three portions (CTR: a portion close to the silicon core wire 1, EDG: a portion close to the side surface of the polycrystalline silicon column 10, and R/2: a portion between CTR and EDG) in order to confirm the presence or absence of radial dependency of the degree of crystal orientation of the polycrystalline silicon column; however, the sample extraction is not limited to extraction from these portions.

The diameter of the polycrystalline silicon column 10 exemplified in FIG. 1A is approximately 120 mm, and a rod 11 having a diameter of approximately 20 mm and a length of approximately 60 mm is cored from the side surface side of the polycrystalline silicon column 10 perpendicularly to the longitudinal direction of the silicon core wire 1.

Then, as shown in FIG. 1B, plate-like samples ($20_{CTR}$, $20_{EDG}$, and $20_{R/2}$), of which the principal plane is the cross-section of the polycrystalline silicon column 10 perpendicular to the radial direction and the thickness is approximately 2 mm, are extracted from the portion (CTR) close to the silicon core wire 1 of this rod 11, the portion (EDG) close to the side surface of the polycrystalline silicon column 10, and the portion (R/2) between the portions CTR and EGD.

The portions of extraction, the length, and the number of the rod 11 may be appropriately determined according to the diameter of the silicon column 10 or the diameter of the rod 11 to be extracted, and the plate-like sample 20 may also be extracted from any portion of the extracted rod 11; however, the position preferably allows the property of the entire silicon column 10 to be reasonably estimated.

The diameter of the plate-like sample 20 being approximately 20 mm is also merely an example, and the diameter can be suitably determined within such a range that does not hinder X-ray diffraction measurement.

In the selection method of a polycrystalline silicon column according to the present invention, the plate-like sample 20 extracted as described above is disposed at positions at which a Bragg reflection from Miller index planes <111> and <220> is detected, the plate-like sample 20 is rotated in a plane to a rotation angle φ, with the center of the plate-like sample 20 as the rotation center, such that an X-ray irradiation region defined by a slit φ-scans the principal plane of the plate-like sample 20 to determine a chart, which indicates the dependency of the intensity of the Bragg reflection from the Miller index plane <hkl> on the rotation angle (φ) of the plate-like sample 20. The polycrystalline silicon is selected as the raw material for producing single crystal silicon depending on the number of peaks appearing in the chart.

Figure 2:
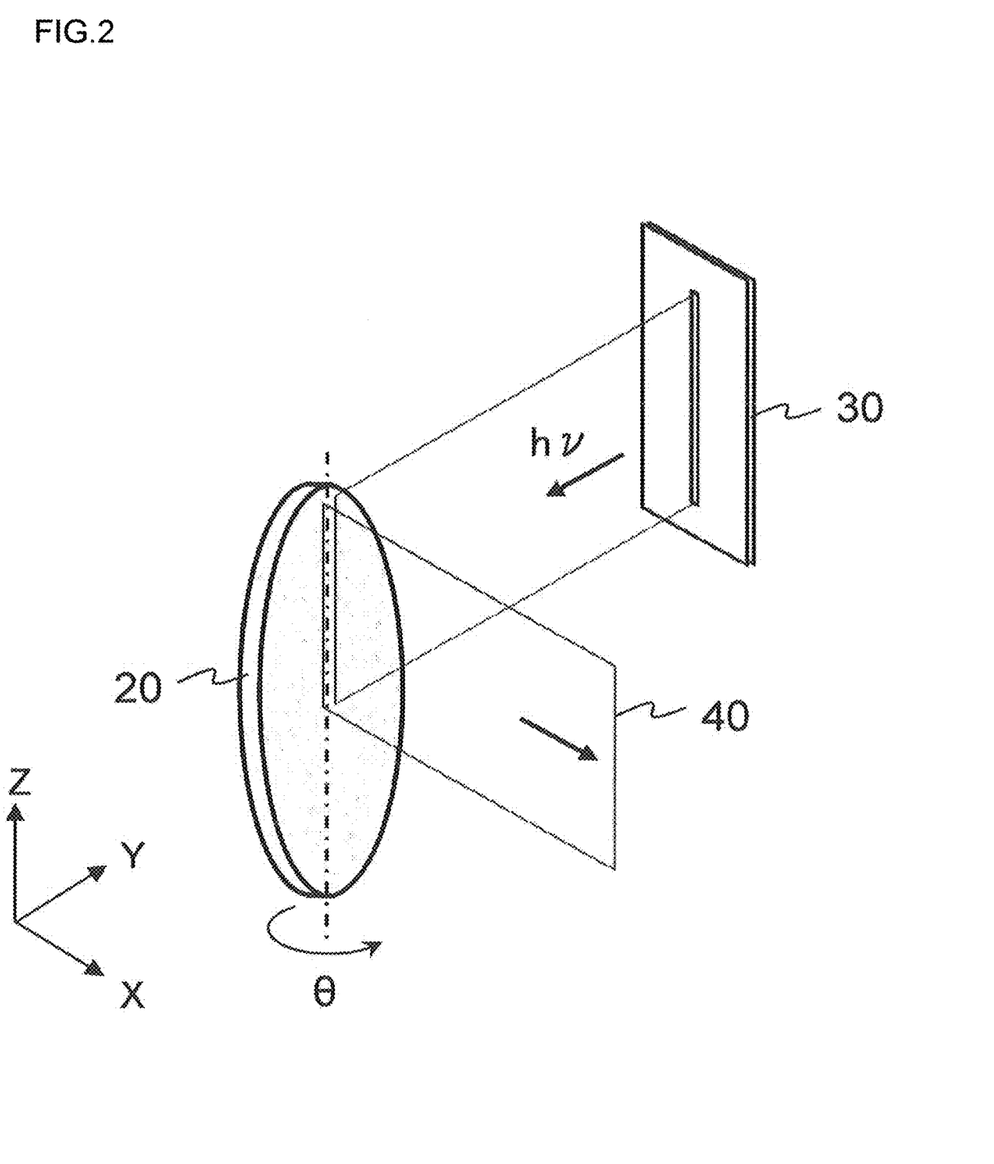
FIG. 2 is a view for describing the outline of an example of a measurement system for determining the X-ray diffraction profile from a plate sample by the so-called θ-2θ method.

FIG. 2 is a view illustrating the outline of an example measurement system for obtaining an X-ray diffraction profile from the plate-like sample 20 by the so-called θ-2θ method. An X-ray beam 40 (Cu-Kα ray: wavelength 1.54 Å) emitted from a slit 30 and collimated enters the plate-like sample 20, and while the plate-like sample 20 is being rotated in the XY-plane, the intensity of the diffracted X-ray beam at each rotation angle (θ) of the sample is detected with a detector (not shown) to obtain a θ-2θ X-ray diffraction chart.

Figure 3:
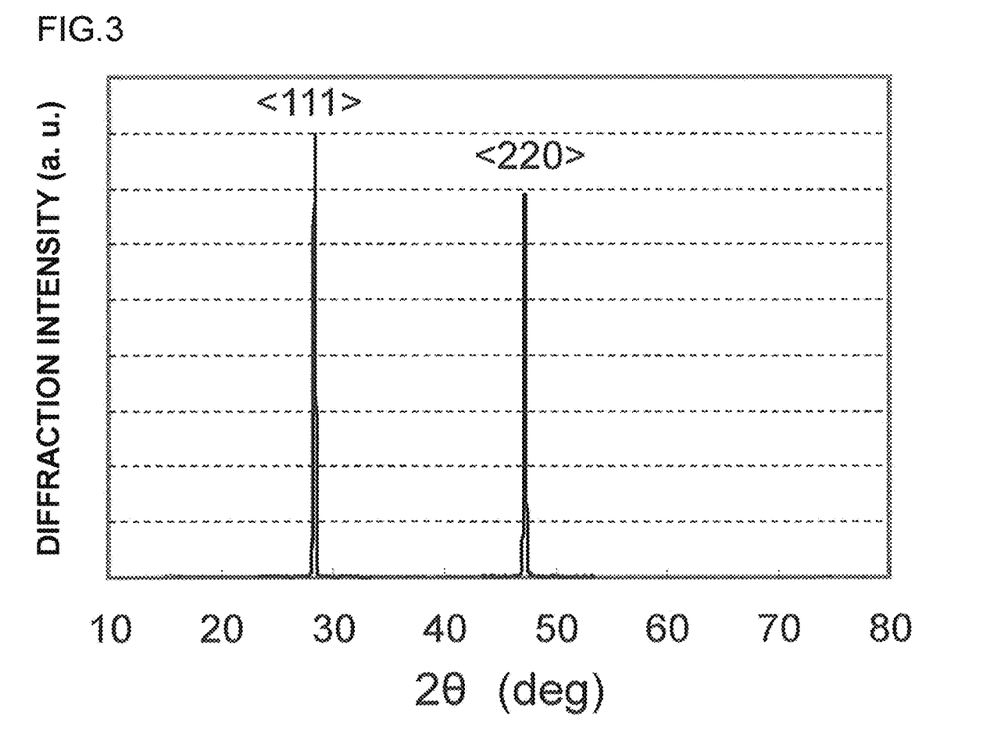
FIG. 3 is an example of a θ-2θ X-ray diffraction chart.

FIG. 3 is an example of the θ-2θ X-ray diffraction chart obtained above, in which intense Bragg reflections from the Miller index planes <111> and <220> appear as peaks at the positions of 2θ=28.40° and 47.24°, respectively.

Figure 4:
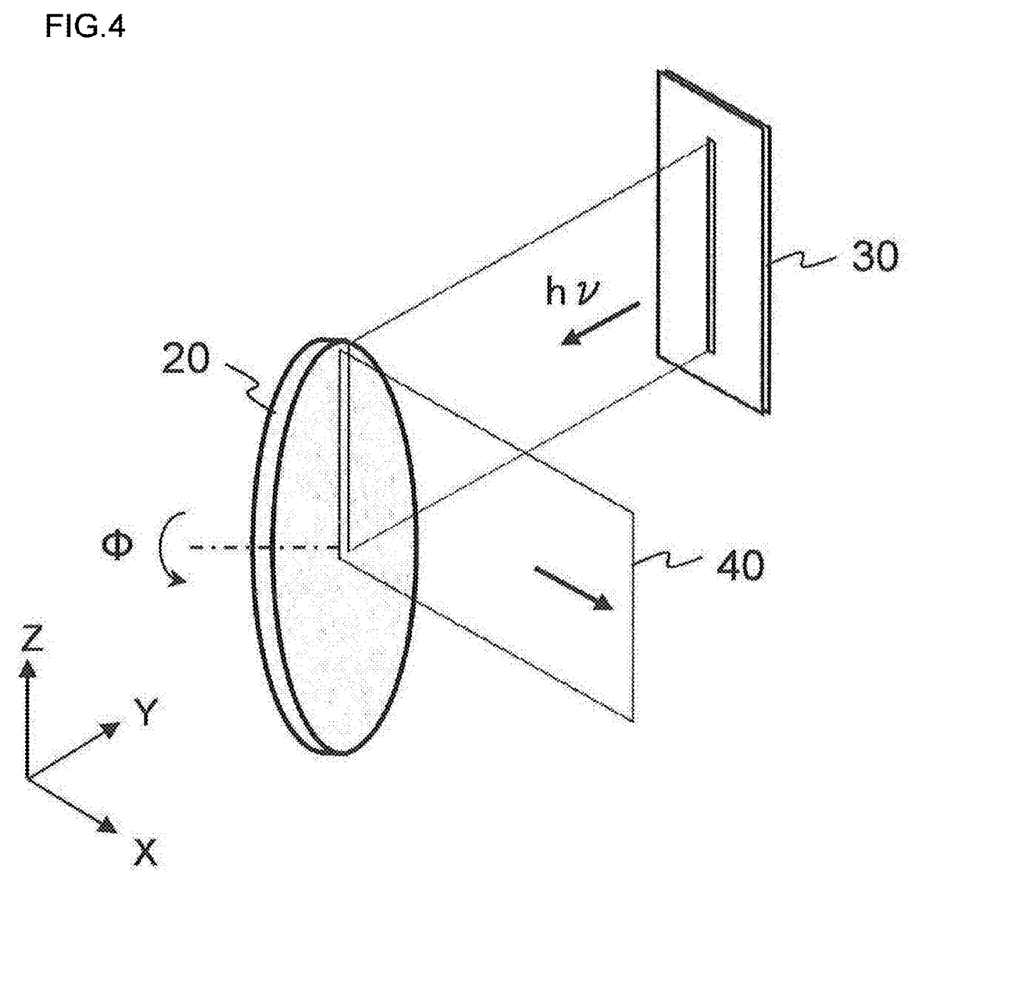
FIG. 4 is a view illustrating the outline of an example of a measurement system for obtaining an X-ray diffraction profile from a plate-like sample by the so-called φ-scanning method.

FIG. 4 is a view illustrating the outline of a measurement system for obtaining an X-ray diffraction profile from a plate-like sample 20 by the so-called φ-scanning method. When the above-described θ of the plate-like sample 20 is assumed to be the angle at which a Bragg reflection from the Miller index plane <111> is detected, and in this state, a thin rectangular region defined by a slit in a region from the center to the circumferential edge of the plate-like sample 20 is irradiated with an X-ray, and the plate-like sample 20 is rotated (φ=0° to 360°) in the YZ-plane, with the center of the plate-like sample 20 as the rotation center, such that the X-ray irradiation region scans the entire surface of the disc-like sample 20. A Bragg reflection from the Miller index plane <220> is also measured by the φ scanning method in the same manner as above.

Figure 5:
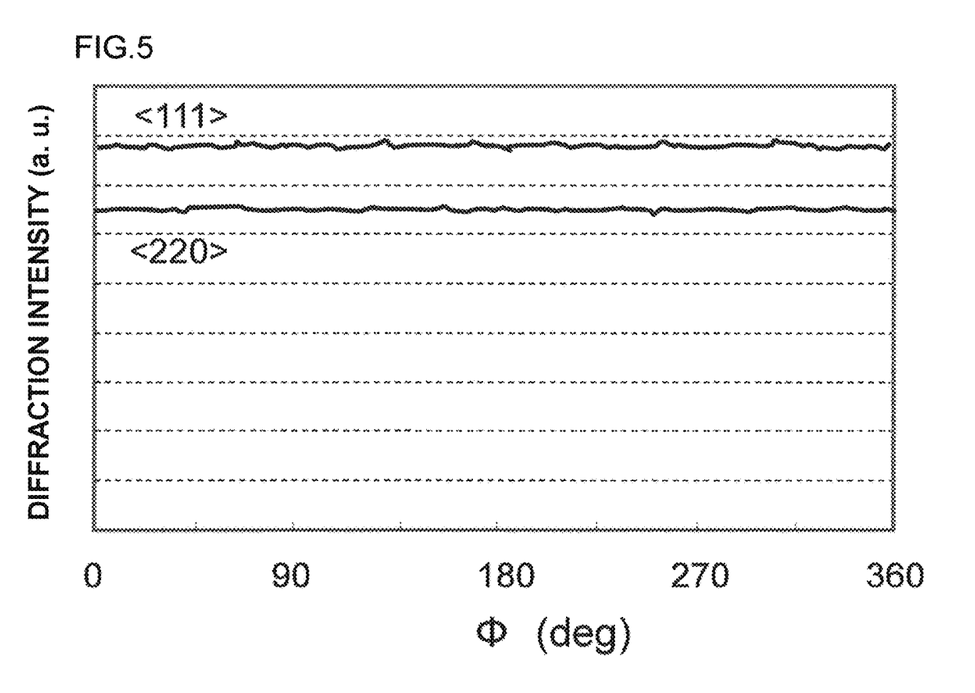
FIG. 5 is an example of a chart obtained by performing the φ-scanning measurement shown in FIG. 4 on Miller index planes <111> and <220>.

FIG. 5 is one example of a chart obtained by performing the φ-scanning measurement as above on Miller index planes <111> and <220>. In this example, the Bragg reflection intensity is substantially constant in any of the aforementioned Miller index planes, and without the dependency of the Bragg reflection intensity on the rotation angle φ, the chart is similar to that of a powder sample. That is, this plate-like sample 20 can be determined to have a low degree of crystal orientation (high random orientation).

Figure 6:
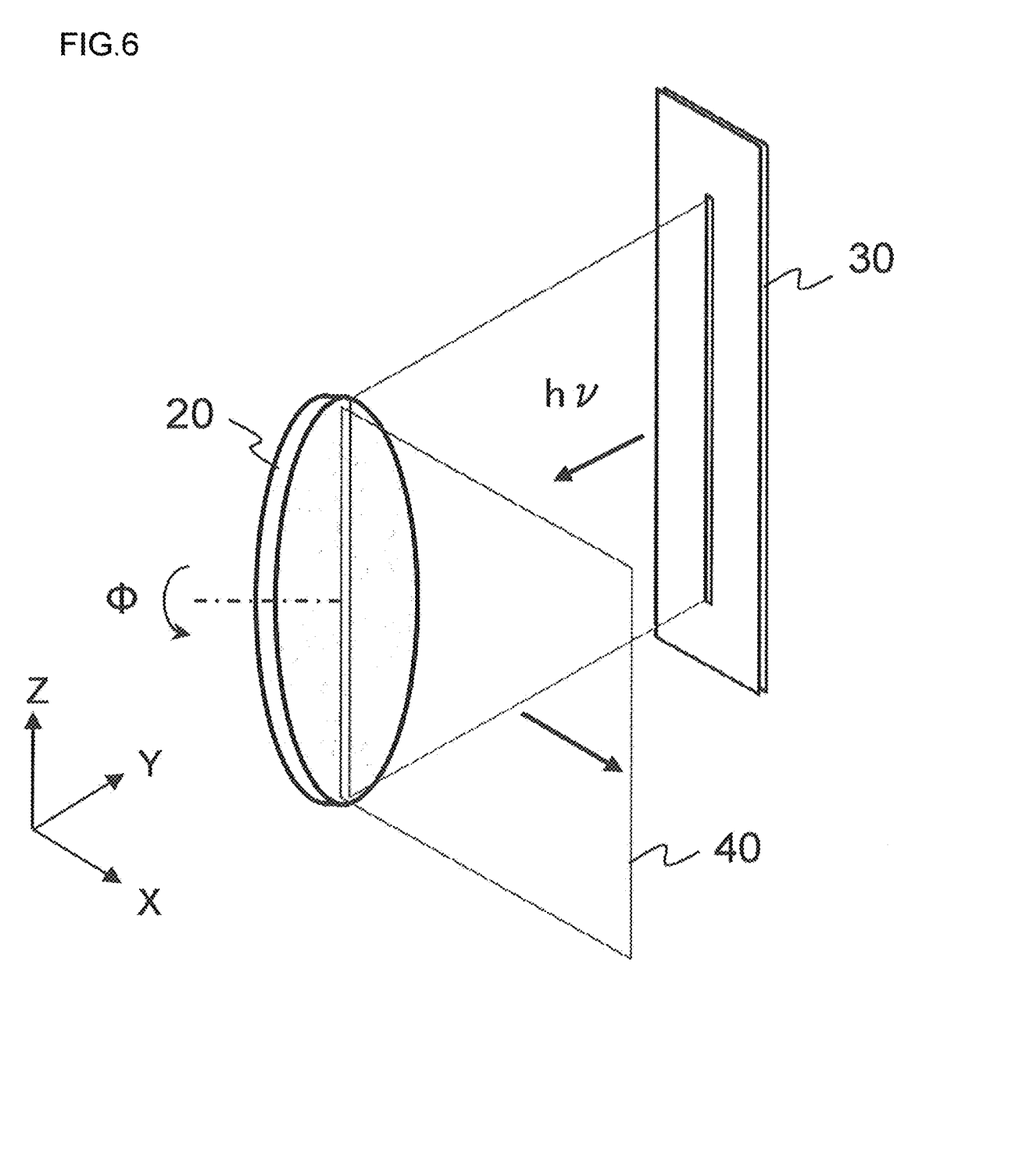
FIG. 6 is a view illustrating the outline of another example of a measurement system for obtaining an X-ray diffraction profile from a plate-like sample by the φ-scanning method.

FIG. 6 is a view illustrating the outline of another example measurement system for obtaining an X-ray diffraction profile from the plate-like sample 20 by the φ-scanning method, and in the example shown in this figure, a thin rectangular region defined by the slit in a region across both the circumferential edges of the plate-like sample 20 is irradiated with an X-ray, and the plate-like sample 20 is rotated (φ=0° to 180°) in the YZ-plane, with the center of the plate-like sample 20 as the rotation center, such that the X-ray irradiation region scans the entire surface of the plate-like sample 20.

Figure 7:
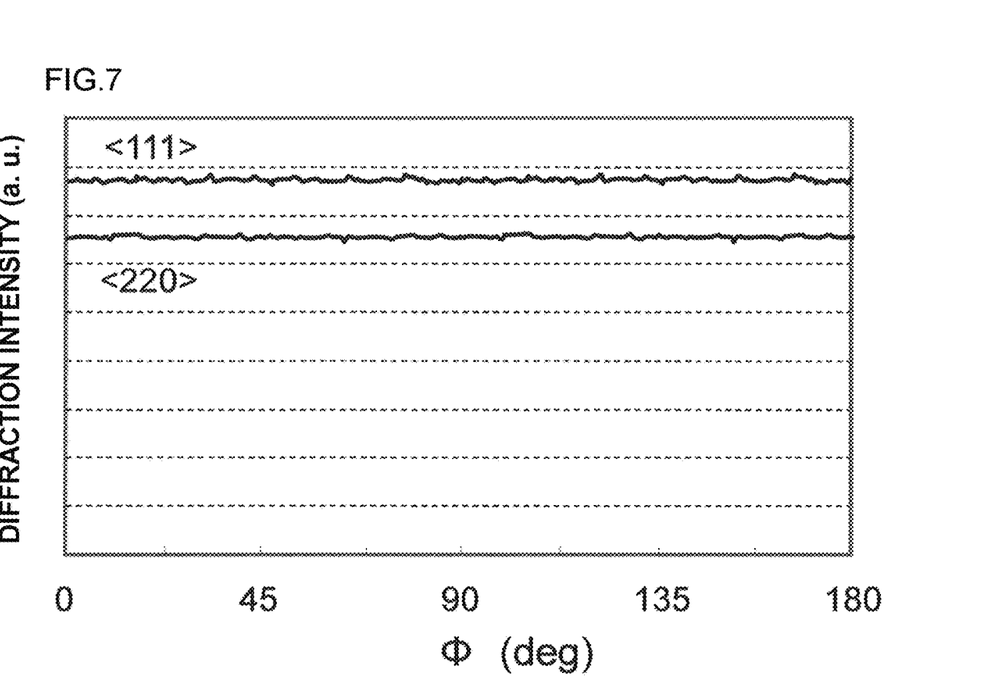
FIG. 7 is an example of a chart obtained by performing the φ-scanning measurement shown in FIG. 6 on Miller index planes <111> and <220>.

FIG. 7 is one example of the chart obtained by performing the above-described φ-scanning measurement on the Miller index planes <111> and <220>, which is a φ-scanning chart substantially the same as that shown in FIG. 5.

While it is unlikely that distribution of degree of crystal orientation occurs in the plane of the plate-like sample 20 extracted in the aspect as shown in FIGS. 1A and 1B, needless to say, the evaluation of crystal orientation according to the present invention is significant not only as a selection method of a polycrystalline silicon column grown by the Siemens method, etc., but also as a method for evaluating a degree of crystal orientation of polycrystalline silicon by the X-ray diffraction method. For example, it is also possible to know presence or absence of the crystal orientation inside a polycrystalline silicon column, or a change in crystal orientation with the increasing diameter of a polycrystalline silicon column, etc. by determining the distribution of degree of crystal orientation in the plane of a plate-like sample which is cut out parallel to the radial direction of a polycrystalline silicon column grown through deposition by the chemical vapor deposition method.

As aforementioned, the present inventors have made extensive studies focusing on the Miller index planes <111> and <220>, and as a result, have found, by evaluation of plate-like samples extracted from polycrystalline silicon columns grown through deposition by a chemical vapor deposition method such as the Siemens method by the XRD method, that the X-ray diffraction intensity from the Miller index planes <111> and <220> varies due to thermal treatment after synthesis by the Siemens method is completed and that, when FZ single crystal silicon is produced from a polycrystalline silicon column including crystal grains having a Miller index plane <111> or <220> as a principal plane and grown due to thermal treatment as the raw material, disappearance of crystal lines in a step of forming an FZ single crystal is substantially completely prevented. Then, it has been found that the X-ray diffraction intensity from either of the Miller index planes <111> and <220> after the thermal treatment is 1.5 times or less the X-ray diffraction intensity before the thermal treatment.

In addition to this fact, in an aspect, it has been found that the crystal grains each have an increased grain size due to the thermal treatment and the average crystal grain size after the thermal treatment is preferably three times or more the average crystal grain size before the thermal treatment. Incidentally, for measurement of the crystal grain size, the plate-like sample was subjected to mirror polishing and then to EBSD (electron backscattered diffraction image) measurement. The crystal grain size distribution for each grain size range was determined to thereby calculate the average crystal grain size.

Additionally, in an aspect, it has been found that the thermal diffusivity varies between before and after the thermal treatment and the thermal diffusivity in a plane perpendicular to the growth direction preferably increases after the thermal treatment. Incidentally, the thermal diffusivity was measured by a method in which the surface of a plate-like sample is irradiated with laser pulse light and thus instantaneously heated to determine the thermal diffusivity from the temperature increase of the back surface of the plate-like sample (laser flash method).

In this case, the thermal treatment aforementioned is required to be conducted in a temperature range of 900 to 1350° C. for a time period of 5 to 6 hours.

The present inventors have confirmed that, when FZ single crystal silicon is produced from polycrystalline silicon, which is obtained by synthesis by the Siemens method followed by thermal treatment in which crystal grains having a Miller index plane <111> or <220> as a principal plane are grown by the thermal treatment, as raw material, disappearance of crystal lines in the step of forming an FZ single crystal is substantially completely prevented.

The thermal treatment may be conducted, for example, after the polycrystalline silicon deposition step in the reactor by the Siemens method is completed, in the reactor.

Furthermore, pulverized pieces of the above polycrystalline silicon column will be a polycrystalline ingot suitable for production of CZ silicon.

The growth phenomenon of crystal grains having a Miller index plane <111> or <220> as a principal plane grown by the above thermal treatment begins to appear at 900° C. or more and becomes marked at 1000° C. or more. However, when the temperature of the thermal treatment reaches the order of 1360° C., adverse effects due to extreme increase in the crystal grain size become non-negligible. Thus, the temperature of the thermal treatment ranges preferably from 900 to 1350° C., more preferably from 1000 to 1300° C.

EXAMPLES

Five polycrystalline silicon columns grown under different deposition conditions (A to E) were provided. From each of these polycrystalline silicon columns, a plate-like sample of which plane parallel to the growth plane as the principal plane and a plate-like sample having a plane perpendicular to the growth plane as the principal plane were extracted. Then, a φ-scanning chart for the Miller index planes <111> and <220> was obtained. Each plate-like sample had a thickness of approximately 2 mm and a diameter of about 20 mm. These polycrystalline silicon columns do not contain so-called "needle crystals".

X-ray diffraction intensity for each of the plate-like samples obtained from these polycrystalline silicon columns was determined to thereby determine the ratio between the intensities before and after the thermal treatment (after thermal treatment/before thermal treatment). The ratios and the dislocation-free rates when a single crystal silicon rod was grown by the FZ method using the polycrystalline silicon column (L %: a ratio of the length of a portion in which no dissertation or disorder of crystal lines occurred to the length of the raw material rod) are summarized in Table 1 and Table 2.

TABLE 1

Amount of <111> detected after thermal treatment, vs. before thermal treatment

| | Comparative Example 1 Polycrystalline silicon A | | Example 1 Polycrystalline silicon B | | Example 2 Polycrystalline silicon C | | Comparative Example 2 Polycrystalline silicon D | | Comparative Example 3 Polycrystalline silicon E | |
|---|---|---|---|---|---|---|---|---|---|---|
| | Parallel plane | Perpendicular plane | Parallel plane | Perpendicular plane | Parallel plane | Perpendicular plane | Parallel plane | Perpendicular plane | Parallel plane | Perpendicular plane |
| 1,000° C. | 1.1 | 1.1 | 1.1 | 1.1 | 1.5 | 1.4 | 1.8 | 1.7 | 1.7 | 1.6 |
| 1,200° C. | 1.1 | 1.1 | 1.4 | 1.3 | 1.5 | 1.5 | 1.9 | 1.8 | 1.7 | 1.6 |
| 1,400° C. | 1.1 | 1.1 | 1.4 | 1.4 | 1.5 | 1.5 | 1.8 | 1.9 | 1.8 | 1.8 |
| FZ, L % | 0 | | 90 | | 100 | | 70 | | 0 | |

TABLE 2

Amount of <220> detected after thermal treatment, vs. before thermal treatment

| | Comparative Example 1 Polycrystalline silicon A | | Example 1 Polycrystalline silicon B | | Example 2 Polycrystalline silicon C | | Comparative Example 2 Polycrystalline silicon D | | Comparative Example 3 Polycrystalline silicon E | |
|---|---|---|---|---|---|---|---|---|---|---|
| | Parallel plane | Perpendicular plane | Parallel plane | Perpendicular plane | Parallel plane | Perpendicular plane | Parallel plane | Perpendicular plane | Parallel plane | Perpendicular plane |
| 1,000° C. | 2.1 | 2.0 | 1.3 | 1.2 | 1.0 | 0.9 | 1.6 | 1.6 | 2.1 | 2.1 |
| 1,200° C. | 2.0 | 2.1 | 1.3 | 1.3 | 1.2 | 1.1 | 1.7 | 1.7 | 2.3 | 2.3 |
| 1,400° C. | 2.1 | 2.2 | 1.4 | 1.4 | 1.4 | 1.3 | 1.8 | 1.8 | 2.4 | 2.5 |
| FZ, L % | 0 | | 90 | | 100 | | 70 | | 0 | |

Incidentally, all these polycrystalline silicon columns were taken out of the furnace after synthesis by the Siemens method was finished, and were subjected to thermal treatment at each temperature in a muffle furnace for six hours.

The average crystal grain size ratios before and after the heat treatment (after thermal treatment/before thermal treatment) are shown in Table 3.

TABLE 3

Average crystal grain size after thermal treatment, vs. before thermal treatment

| | Comparative Example 1 Polycrystalline silicon A | | Example 1 Polycrystalline silicon B | | Example 2 Polycrystalline silicon C | | Comparative Example 2 Polycrystalline silicon D | | Comparative Example 3 Polycrystalline silicon E | |
|---|---|---|---|---|---|---|---|---|---|---|
| | Parallel plane | Perpendicular plane | Parallel plane | Perpendicular plane | Parallel plane | Perpendicular plane | Parallel plane | Perpendicular plane | Parallel plane | Perpendicular plane |
| 1,000° C. | 1.9 | 1.9 | 3.1 | 3.1 | 4.8 | 5.0 | 2.0 | 2.1 | 2.3 | 2.1 |
| 1,200° C. | 2.2 | 2.1 | 3.1 | 3.0 | 7.5 | 8.0 | 2.1 | 2.3 | 2.6 | 2.6 |
| 1,400° C. | 2.3 | 2.3 | 3.3 | 3.4 | 9.9 | 9.8 | 2.3 | 2.3 | 2.5 | 2.6 |
| FZ, L % | 0 | | 90 | | 100 | | 70 | | 0 | |

The increases or decreases in the thermal diffusivity after thermal treatment are shown in Table 4.

TABLE 4

Thermal diffusivity after thermal treatment, vs. before thermal treatment

| | Comparative Example 1 Polycrystalline silicon A | | Example 1 Polycrystalline silicon B | | Example 2 Polycrystalline silicon C | | Comparative Example 2 Polycrystalline silicon D | | Comparative Example 3 Polycrystalline silicon E | |
|---|---|---|---|---|---|---|---|---|---|---|
| | Parallel plane | Perpendicular plane | Parallel plane | Perpendicular plane | Parallel plane | Perpendicular plane | Parallel plane | Perpendicular plane | Parallel plane | Perpendicular plane |
| 1,000° C. | Increase | Decrease | Decrease | Increase | Decrease | Increase | Increase | Decrease | Increase | Decrease |
| 1,200° C. | Increase | Decrease | Decrease | Increase | Decrease | Increase | Increase | Decrease | Increase | Decrease |
| 1,400° C. | Increase | Decrease | Decrease | Increase | Decrease | Increase | Increase | Decrease | Increase | Decrease |
| FZ, L % | 0 | | 90 | | 100 | | 70 | | 0 | |

From the results shown in these Tables, it can be confirmed that, when FZ single crystal silicon is produced from polycrystalline silicon, which is obtained by synthesis by the Siemens method followed by thermal treatment in which crystal grains having a Miller index plane <111> or <220> as a principal plane are grown by the thermal treatment, and in which the X-ray diffraction intensity from either of the Miller index planes <111> and <220> after the thermal treatment is 1.5 times or less the X-ray diffraction intensity before the thermal treatment, as raw material, disappearance of crystal lines in the step of forming an FZ single crystal is markedly prevented.

INDUSTRIAL APPLICABILITY

The present invention provides polycrystalline silicon suitable as the raw material for producing single crystal silicon.

REFERENCE SIGNS LIST 1 silicon core wire
10 polycrystalline silicon column
11 rod
20 plate-like sample
30 slit
40 X-ray beam

What is claimed is:

1. A polycrystalline silicon obtained by synthesis by the Siemens method followed by thermal treatment, wherein crystal grains having Miller index planes <111> and <220> as a principal plane are grown by the thermal treatment an wherein X-ray diffraction intensity from either of the Miller index planes <111> and <220> after the thermal treatment is 1.5 times or less X-ray diffraction intensity before the thermal treatment.

2. The polycrystalline silicon according to claim 1, wherein the crystal grains have an increased grain size due to the thermal treatment.

3. The polycrystalline silicon according to claim 1, wherein a thermal diffusivity varies between before and after the thermal treatment.

4. The polycrystalline silicon according to claim 2, wherein an average crystal grain size after the thermal treatment is three times or more an average crystal grain size before the thermal treatment.

5. The polycrystalline silicon according to claim 3, wherein the thermal diffusivity in a plane perpendicular to the growth direction increases after the thermal treatment.

6. A method for producing FZ single crystal silicon using the polycrystalline silicon according to claim 1 as a raw material.

7. FZ single crystal silicon obtained by the production method according to claim 6.

* * * * *